US011551950B2

(12) United States Patent
Rohrmann et al.

(10) Patent No.: US 11,551,950 B2
(45) Date of Patent: Jan. 10, 2023

(54) SUBSTRATE PROCESSING APPARATUS AND METHOD OF PROCESSING A SUBSTRATE AND OF MANUFACTURING A PROCESSED WORKPIECE

(71) Applicant: EVATEC AG, Trubbach (CH)

(72) Inventors: Hartmut Rohrmann, Schriesheim (DE); Heinz Felzer, Landquart (CH); Dominik Jaeger, Chur (CH); Hubert Breuss, Rankweil (AT)

(73) Assignee: EVATEC AG, Trübbach (CH)

( * ) Notice: Subject to any disclaimer, the term of this patent is extended or adjusted under 35 U.S.C. 154(b) by 246 days.

(21) Appl. No.: 16/767,160

(22) PCT Filed: Nov. 27, 2018

(86) PCT No.: PCT/EP2018/082728
§ 371 (c)(1),
(2) Date: May 27, 2020

(87) PCT Pub. No.: WO2019/105944
PCT Pub. Date: Jun. 6, 2019

(65) Prior Publication Data
US 2020/0388517 A1 Dec. 10, 2020

(30) Foreign Application Priority Data
Nov. 28, 2017 (CH) .................................. 01451/17

(51) Int. Cl.
*H01L 21/67* (2006.01)
*H01L 21/66* (2006.01)
(52) U.S. Cl.
CPC .. *H01L 21/67248* (2013.01); *H01L 21/67109* (2013.01); *H01L 22/26* (2013.01)

(58) Field of Classification Search
CPC .................. H01L 21/67248; H01L 21/67253
See application file for complete search history.

(56) References Cited

U.S. PATENT DOCUMENTS 6,179,465 B1 * 1/2001 Yam ..................... G01J 5/53
374/2
6,183,130 B1 * 2/2001 Adams .................. G01J 5/0818
219/405

(Continued)

FOREIGN PATENT DOCUMENTS

| EP | 0886303 A2 | 12/1998 |
| JP | H1140510 A | 2/1999 |
| WO | 2014032192 A1 | 3/2014 |

OTHER PUBLICATIONS

International Search Report and Written Opinion for PCT/EP2018/082728 dated Feb. 12, 2019.

*Primary Examiner* — Jae Lee
(74) *Attorney, Agent, or Firm* — Pearne & Gordon LLP

(57) ABSTRACT

A substrate processing apparatus includes a base with a process-side surface and a substrate support arranged on the process-side surface and designed to carry a substrate at its periphery. The periphery, more specifically the plane defined by the periphery, is spaced apart from the process-side surface. The substrate processing apparatus also includes a radiation sensor adapted to measure electromagnetic radiation arranged on a side of a back-side surface of the base. A radiation channel is arranged between the radiation sensor and the periphery of the substrate support, more specifically between the radiation sensor and the plane defined by the periphery, wherein the radiation channel is at least partially permeable to electromagnetic radiation.

22 Claims, 5 Drawing Sheets

(56) References Cited

U.S. PATENT DOCUMENTS

| | | |
|---|---|---|
| 2002/0020696 A1 | 2/2002 | Kitamura et al. |
| 2006/0100735 A1 | 5/2006 | Hauf et al. |
| 2009/0159000 A1 | 6/2009 | Aggarwal et al. |
| 2010/0008656 A1 | 1/2010 | Sorabji et al. |
| 2013/0157460 A1* | 6/2013 | Fu .................... H01L 21/28052 |
| | | 438/660 |

* cited by examiner

SUBSTRATE PROCESSING APPARATUS AND METHOD OF PROCESSING A SUBSTRATE AND OF MANUFACTURING A PROCESSED WORKPIECE

TECHNICAL FIELD OF THE INVENTION

The present invention refers to a substrate processing apparatus. It further refers to a method of processing a substrate and of manufacturing a processed workpiece in such a substrate processing apparatus.

Definitions

Processing in the sense of this invention includes any chemical, physical or mechanical effect acting on substrates. Furthermore, processing also includes, either alone or in combination with chemical, physical or mechanical effect acting, temperature conditioning. Such conditioning shall be understood to include heating up a substrate to a desired temperature, keeping a substrate at a desired temperature and cooling a substrate to remain at a desired processing temperature, e.g. when the processing itself tends to overheat a substrate.

Substrates in the sense of this invention are components, parts or workpieces to be treated in a processing apparatus. Substrates include but are not limited to flat, plate shaped parts having rectangular, square or circular shape. In a preferred embodiment this invention addresses essentially planar, circular substrates, such as wafers. The material of such wafers may be glass, semiconductor, ceramic or any other substance able to withstand the processing temperatures described.

A vacuum processing or vacuum treatment system/apparatus/chamber comprises at least an enclosure for substrates to be treated under pressures lower than ambient atmospheric pressure plus means for processing said substrates.

A chuck or clamp is a substrate holder or support adapted to fasten a substrate during processing. This clamping may be achieved, inter alia, by electrostatic forces (electrostatic chuck ESC), mechanical means, vacuum or a combination of aforesaid means. Chucks may exhibit additional facilities like temperature control components (cooling, heating) and sensors (substrate orientation, temperature, warping, etc.)

CVD or Chemical Vapour Deposition is a chemical process allowing for the deposition of layers on heated substrates. One or more volatile precursor material(s) are being fed to a process system where they react and/or decompose on the substrate surface to produce the desired deposit. Variants of CVD include: Low-pressure CVD (LPCVD)- CVD processes at sub-atmospheric pressures. Ultrahigh vacuum CVD (UHVCVD) are CVD processes typically below $10^{-6}$ Pa/$10^{-7}$ Pa. Plasma methods include Microwave plasma-assisted CVD (MPCVD), Plasma-Enhanced CVD (PECVD). These CVD processes utilize plasma to enhance chemical reaction rates of the precursors.

Physical vapour deposition (PVD) is a general term used to describe any of a variety of methods to deposit thin films by the condensation of a vaporized form of a material onto a surface of a substrate (e.g. onto semiconductor wafers). The coating method involves purely physical processes such as high temperature vacuum evaporation or plasma sputter bombardment in contrast to CVD. Variants of PVD include Cathodic Arc Deposition, Electron beam physical vapour deposition, Evaporative deposition, Sputter deposition (i.e. a glow plasma discharge usually confined in a magnetic tunnel located on a surface of a target material).

The terms layer, coating, deposit and film are interchangeably used in this disclosure for a film deposited in vacuum processing equipment, be it CVD, LPCVD, plasma enhanced CVD (PECVD) or PVD (physical vapour deposition).

BACKGROUND OF THE INVENTION

Substrate processing apparatuses and methods of processing substrates or manufacturing processed workpieces in a substrate processing apparatus are wildly known. It is also known that there is a plurality of parameters, such as pressure, temperature, processing time and so on, influencing the quality of the processed product, i.e. the processed substrate or workpiece. However, controlling such parameters in real life, and in particular in real time, can be rather challenging. Consequently, there is a constant need of controlling such parameters in a more reliable and precise way in order to enhance the quality of the processed product, e.g. by providing improved substrate processing apparatuses and/or improved methods of processing substrates. In particular for apparatuses where the substrate is treated from one side and heated from a side opposite to said one side, it is very difficult to detect the actual conditions of the substrate during its processing. This is in particular caused by a limited access to the substrate during its processing.

SUMMARY OF THE INVENTION

It is thus an objective of the invention to provide a substrate processing apparatus, which is simple in design and which allows the detection of a substrate's actual conditions during its processing.

This is reached by a substrate processing apparatus according to the invention. The substrate processing apparatus comprises:
- a base with an extended, essentially plane process-side surface,
- a substrate support, arranged on the process-side surface and designed to carry a substrate at its periphery, the periphery being spaced apart from the process-side surface, wherein the substrate processing apparatus further comprises:
- at least one radiation sensor adapted to measure electromagnetic radiation, arranged on a side of a back-side surface of the base, opposite the process-side surface,
- at least one radiation channel, arranged between the at least one radiation sensor and the periphery of the substrate support, wherein the radiation channel is at least partially permeable to electromagnetic radiation.

More specifically, the periphery of the substrate support defines a plane and this plane is being spaced apart from the process-side surface. Furthermore, in a more specific manner, the at least one radiation channel is arranged between the at least one radiation sensor and the plane defined by the periphery of the substrate support The radiation sensor allows the detection of electromagnetic radiation that can be correlated to the conditions of a substrate to be coated during its processing. For example, the temperature of the substrate facing the base can be determined. In this case, the radiation sensor can be an optical temperature sensor. Such a temperature determination is in particular interesting as it can be used, for instance, to trigger the substrate processing process, e.g. initiating the start of a physical vapour deposition process. By starting the deposition of target material from a predefined preferred substrate temperature on (e.g. 800° C.), it is possible to generate a more homogenous deposition layer resulting in a processed substrate of a higher quality. Furthermore, the temperature determination can be used to control a stepwise heating of a substrate, in particular being useful when depositing more than one layer and/or layers of different materials. Alternatively, the radiation detected by the radiation sensor can be correlated to the emission of a radiation source, e.g. a plasma ignition, provided at a side of the substrate to be coated and opposite to the base, in particular at the side of the substrate being opposite to the side facing the heating element, to determine the thickness of the coating on the substrate to be coated. The thicker the coating, the more of the emitted radiation is absorbed by the coating and the less radiation can be detected with the radiation sensor. The arrangement of the radiation detector on the side of the back-side surface of the base can also mean that the sensor is arranged spaced apart from the back-side surface. The sensor can also be arranged sideways with respect to the base and thus, could also be arranged on the side of the front-side of the base, but with a lateral offset. In this case, the radiation channel would be longer and would not extend along a straight line. A curved or multi-curved extension of the radiation channel is also possible. There can be more than one radiation detector and more than one corresponding radiation channel. For example, there can be two, three, four, five, six or more detectors and corresponding channels, with the help of which, the actual condition of the substrate during processing can be detected simultaneously or one after the other. It is possible to combine several radiation channels with one radiation detector, wherein a bundle of radiation channels is collected at one specific location, where the radiation detector is allocated. The radiation channels and/or the radiation detectors can be distributed evenly over the front-side surface of the base or they can be arranged in specific areas, such as along the projection of the periphery of the substrate support, more specifically along the projection of the plane defined by said periphery, to the front-side surface of the base or along the projection of the middle lines of the periphery of the substrate support, more specifically along the projection of the middle lines of the plane defined by said periphery, to the front-side surface of the base.

The word "detector", as known in the art, can be used as synonym for the word "sensor".

In an embodiment, the radiation channel comprises a passage in the base, extending from the process-side surface to the back-side surface, and at least one radiation conductor. This design increases the distance between the substrate during processing and the radiation sensor, thus preventing the sensor from being influenced negatively by the processing conditions, i.e. by heat or coating material.

In an embodiment, a heating element is arranged on the base, between the periphery, more specifically between the plane defined by said periphery, of the substrate support and the process-side surface, wherein the heating element comprises a passage, allowing the passage of electromagnetic radiation from the periphery, more specifically from the plane defined by said periphery, of the substrate support to the process-side surface. With the heating element, a predefined optimal process temperature of the substrate to be processed can be maintained during processing. A substrate temperature in the range of 100 to 1'200 degree Celsius, preferably in the range of 750 to 1'000 degree Celsius is desired. An in-situ temperature detection by means of the radiation sensor, for example an optical temperature sensor, can be used for controlling the temperature of the heating element and thus of the substrate to be processed. The passage in the heating element prevents that electromagnetic radiation, emitted by the heating element, negatively interferes with the measurements of the radiation sensor. Alternatively, a temperature-controlled atmosphere in the substrate processing apparatus can be used to control the temperature of the substrate.

In an embodiment, a heat reflecting surface is arranged on the process-side surface, wherein the heat reflecting surface comprises a passage, allowing the passage of electromagnetic radiation from the periphery, more specifically from the plane defined by said periphery, of the substrate support through the heat reflecting surface. The heat reflecting surface prevents the dissipation of heat through the base, thereby reducing the thermal load on the base and thus reducing the required energy consumption of the heating source, e.g. of the heating element.

In an embodiment, a source of treatment material is arranged at a distance from the periphery, more specifically at a distance from the plane defined by said periphery, of the substrate support on the opposite side of the base. The source of treatment material may be any of PVD, CVD or activated gas sources (e.g. for cleaning, after-treatment, surface modifications or etching), such as for example a target or an evaporation crucible.

In an embodiment, an enclosure is provided, which surrounds at least the base and the substrate support and in a further embodiment, the enclosure additionally surrounds the source of treatment material. The enclosure preferably is a sealed or sealable compartment, thus enabling the creation of a vacuum within the enclosure.

In an embodiment, a radiation conductor is arranged on the back-side surface or on the heat reflecting surface. The allocation of the radiation conductor at a distance from the periphery, more specifically from the plane defined by said periphery, of the substrate support prevents the negative influence on the radiation conductor by means of, for example, some coating material. The radiation conductor can be permeable for a wide range of electromagnetic radiation, e.g. for electromagnetic radiation with a wavelength of 1 nanometre to several centimetres, i.e. X-ray to Microwave.

Alternatively, the radiation conductor can prevent at least one range of electromagnetic radiation from passing through the radiation conductor. Thus, only allowing the passage of electromagnetic radiation with a specific wavelength range through the radiation conductor. For example, electromagnetic radiation with a wavelength of 500 nanometres to 100 micrometres. Alternatively, the radiation conductor is designed as such that only a specific wavelength can pass through the radiation conductor, for example, with a wavelength of 900 nanometres. The radiation conductor can be a glass or an optical fibre. It is recommended to keep the viewing port of the radiation channel small, i.e. the opening of the passages or the diameter of the radiation conductor respectively. Thereby, the amount of direct and indirect (e.g. reflected) electromagnetic radiation that can be detected by the radiation sensor is reduced, thus increasing the sensitivity of the detection. To reduce the amount of radiation from the heating element that can enter the radiation conductor, the inlet surface of the radiation conductor, facing the substrate during its processing, can be arranged between the heating element and the periphery of the substrate support, more specifically between the heating element and the plane defined by said periphery. For the protection of the elongate radiation conductor, i.e. the optical fibre, an additional radiation conductor can be arranged between the optical fibre and the periphery of the substrate support, more specifically between the optical fibre and the plane defined by said periphery. The additional radiation conductor can be a plate arranged on top of the radiation conductor, a sleeve covering the inlet surface and/or part of the lateral surface of the optical fibre. The sleeve can be made entirely from a material permeable for electromagnetic radiation or can only comprise an electromagnetic radiation permeable material in the part covering the inlet surface. In case it is essentially only the lateral part of a radiation conductor being surrounded by a sleeve, a sleeve with an inner and/or outer surface having reflective properties is preferred. The reflective outer wall protects the radiation conductor from unwanted radiation, e.g. scattered radiation or radiation originating from the heating element. The reflective inner wall prevents a loss of radiation that entered though the lateral surface of the radiation conductor and thus increases the efficiency of the temperature determination. Consequently, the sleeve can be made of metal, can comprise a metal or can comprise a reflective coating.

In an embodiment, a first radiation conductor is arranged within the passage of the base or within the passages of the base and the heat reflecting surface or within the passages of the base, the heat reflecting surface and the heating element. The closer the radiation conductor to the periphery, more specifically to the plane defined by said periphery, of the substrate support, i.e. to the substrate to be processed during operations, the smaller is the amount of scattered radiation, which is able to enter the radiation conductor. Thus, improving the quality of the detected radiation by means of the radiation detector.

In an embodiment, an additional radiation conductor is arranged on a surface of the reflecting surface, covering at least the passage of the reflecting surface. The additional radiation conductor protecting the underlying radiation conductor. The additional radiation conductor is small and therefore less expensive. If the additional radiation conductor is polluted or coated with treatment material or destroyed due to mechanical or thermal load, it can be replaced easily and doesn't cost as much as the underlying radiation conductor.

In an embodiment, the first radiation conductor is laterally surrounded by a sleeve. The additional radiation conductor is arranged on the front-face side of the sleeve at a distance to the front-face side of the first radiation conductor. On the one hand, the sleeve protects the first radiation conductor from radiation. On the other hand, the sleeve protects the first radiation conductor from thermal energy, i.e. temperature.

In an embodiment, a sealing material is arranged between the radiation conductor and the base. Due to different thermal expansion coefficients, the radiation conductor and the base have a different thermal expansion, which leads to mechanical stress, when they are in direct contact with each other. A sealing material, e.g. a ceramic glue, reduces the mechanical stress. Thus, preventing the radiation conductor from breaking.

In an embodiment, the sealing material is arranged between the radiation conductor and the sleeve and/or between the sleeve and the base.

In an embodiment, cooling channels are arranged in the base. The cooling channels prevent the dissipation of heat through the base towards the side of the back-side surface of the base and thus, protect for example the radiation sensor from thermal load. At the same time, the thermal expansion of the base is reduced, which results in smaller geometrical deviations of the base and thus, for example, of the periphery of the substrate support that is mounted on the base. Thereby the accuracy and repeatability of the process is increased.

In an embodiment, the radiation channel is cooled actively by means of cooling lines arranged within the radiation channel. In the case, where the radiation conductor is an optical fibre, the cooling lines can be combined with the optical fibre and form a unit that can be introduced jointly in the passages of the base, the heat reflecting surface and/or the heating element. Alternatively, the radiation conductor can be cooled passively, just by being in contact with the base. For instance, a sleeve that is laterally surrounding a radiation conductor can be cooled indirectly through the cooled base. The base can comprise cooling channels that are arranged in the region around the passage of the base.

In an embodiment, the substrate processing apparatus comprises a base with an extended, essentially plane process-side surface, a substrate support arranged on the process-side surface and having a periphery designed to carry a substrate, and a heating element arranged on the base between the periphery of the substrate support and the process-side surface of the base, more specifically between the plane defined by said periphery and the process-side surface of the base. The heating element comprises a passage allowing the passage of electromagnetic radiation from the periphery, more specifically from the plane defined by said periphery, of the substrate support to the process-side surface, i.e. from a substrate when carried by the substrate support to the process-side surface. The substrate processing apparatus further comprises at least one radiation sensor adapted to measure electromagnetic radiation and at least one radiation channel arranged between the at least one radiation sensor and the periphery, more specifically the plane defined by said periphery, of the substrate support, i.e. between the at least one radiation sensor and a substrate when carried by the substrate support. The radiation channel is at least partially permeable to electromagnetic radiation.

Optionally, the apparatus comprises a source of treatment material (may be any of PVD, CVD or activated gas sources) that is arranged at a distance from the periphery, more specifically from the plane defined by said periphery, of the substrate support and opposite to the base. The source of treatment material is arranged such that the periphery, more specifically the plane defined by said periphery, of the substrate support is sandwiched between the heating element and the source of treatment material. This means that the source of treatment material is arranged opposite and distant to the heating element such that a substrate, when carried by the substrate support, gets heated from the side of the substrate facing the heating element and treated from the side facing the source of treatment material.

In a further embodiment of the apparatus having a radiation channel that comprises a passage in the base, extending from the process-side surface to the back-side surface, and at least one radiation conductor, one of the at least one radiation conductors is arranged completely within the passage in the base. Said one radiation conductor may either be flush with both ends of the passage or with one of the ends of the passage, in particular with the end of the passage belonging to the process-side surface of the base.

In an even further embodiment of the apparatus having a radiation channel that comprises a passage in the base, extending from the process-side surface to the back-side surface, and at least one radiation conductor, one, several or all of the at least one radiation conductors are arranged such that they do not protrude from the end of the passage belonging to the process-side surface.

Said one, several or all radiation conductors are preferably arranged such that they extend only along a part of the passage. The one, several or all radiation conductors are in particular arranged in a manner leaving some clearance in relation to the end of the passage belonging to the process-side surface, i.e. keeping some distance to the process-side surface. Such a clearance allows the passage in the base to work as a hole aperture. In such an embodiment, in particular if there is no lens present, it is preferred that the diameter of the passage in the base is not larger than 120% of the diameter of the one, several or all radiation conductors, in particular of the diameter of the radiation conductor being closest to the end of the passage belonging to the process-side surface. The hole aperture effect can be adjusted not only by adapting the cross-sectional areas of the passage in the base and the radiation conductor to each other but also by varying the distance of the radiation conductor to the process-side surface of the base and thus the size of the clearance.

In case the radiation channel further comprises a passage in a heat reflecting surface on the process-side surface of the base, the passage in the heat reflecting surface is also contributing or even fully dominating the hole aperture effect. The foregoing teaching can be applied accordingly.

In an embodiment, the radiation channel comprises at least one focussing lens. Such a lens can be arranged within the passage of the base, within the passage of the heat reflecting surface, within the passage of the heating element, between the passage of the base and the passage of the heating element, between the passage of the heat reflecting surface and the passage of the heating element, and/or between the passage of the heating element and the periphery, more specifically the plane defined by said periphery, of the substrate support. It is also possible to design one or more of the radiation channels such that a lens is instantly formed.

As the lens comprises two refraction surfaces, in particular at least one of those being either concave or convex, the lens can focus radiation. Consequently, it can be used to improve the setup of the radiation channel in general and the arrangement of the radiation conductor(s) within the radiation channel in particular. It is for instance possible to increase the distance of a radiation conductor to the periphery, more specifically to the plane defined by said periphery, of the substrate support by the use of a lens. When having, e.g., a setup with a radiation conductor arranged in the passage of the base, the distance of said radiation conductor to the process-side surface of the base and thus to the heating element and the periphery, more specifically to the plane defined by said periphery, of the substrate support can be increased by using a lens on top of the radiation conductor without losing any radiation intensity as the lens is focusing the radiation.

In a preferred embodiment, at least one lens is arranged within the passage of the base. In a further preferred embodiment, the lens is arranged between a first and an additional radiation conductor, the additional radiation conductor protecting the lens. In an even further preferred embodiment, the lens, the first and the additional radiation conductor are arranged within the passage in the base, the additional radiation conductor being preferably arranged flush with the process-side surface of the base.

In an embodiment, the acceptance angle of the radiation sensor is maximum 45°, in particular maximum 30°, and further in particular maximum 15°. The minimum acceptance angle is basically only limited by the required sensor signal and its signal to noise ratio. The acceptance angle is predominantly defined by the setup of the radiation channel and can be influenced by e.g. adjusting the diameter of the passage of the base, the diameter of the passage of the heat reflecting surface, the diameter of the passage of the heating element, the distances between the base, the heat reflecting surface, the heating element and/or the periphery, more specifically the plane defined by said periphery, of the substrate support, the amount and location of the radiation conductors, the presence, amount and location of one or more lenses, the presence, size and location of gaps between the radiation conductors and or the lenses, . . . .

In an embodiment the radiation channel comprises at least one wavelength converter. A wavelength converter is in particular beneficial when the radiation emitted by the substrate can hardly be detected by the radiation sensor, e.g. because of the radiation conductor not being capable of conducting said radiation properly.

The implementation of a wavelength converter is also beneficial for an apparatus comprising a radiation conductor preventing at least one range of electromagnetic radiation from passing through and/or a radiation conductor designed such that only a specific wavelength can pass though.

A wavelength converter should be arranged between the periphery, more specifically between plane defined by said periphery, of the substrate support and the radiation conductor such that emitted radiation reaching the radiation conductor must first pass the wavelength converter. The wavelength converter may comprise two pieces, one piece absorbing the radiation emitted by the substrate and one piece emitting radiation towards the radiation conductor.

Alternatively, the wavelength converter consists of one piece comprising a coating, e.g. a silicon coating or an aluminium oxide coating.

In an embodiment, the heating element is a radiation heater, in particular a carbon heater and/or a lamp heater. The radiation heater may also be a zone heater comprising e.g. 2, 3, 4, 5, 6 or more temperature zones that can be controlled individually, in particular by means of more than one radiation detectors determining the temperature of more than one zone of a substrate, in particular each substrate zone corresponding to one temperature zone.

A heating element, which comprises a diameter being approximately 20 to 50 mm larger than the diameter of the substrate to be heated (e.g. 240 mm for a 200 mm substrate, 340 mm for a 300 mm substrate, or a similar relationship for rectangular substrates), may comprise a passage for the passage of electromagnetic radiation having a diameter of approximately 5 to 30 mm, preferably from 8 to 20 mm, in particular 10 to 15 mm.

The features of the above-mentioned embodiments of the apparatus can be used in any combination, unless they contradict each other.

A method of processing a substrate and of manufacturing a processed workpiece in a substrate processing apparatus according to the invention comprises the steps of:
  providing a substrate processing apparatus according to the invention,
  placing a substrate on the periphery of the substrate support,
  coating the substrate, and
  detecting electromagnetic radiation with the radiation sensor.

In an embodiment, the method additionally comprises the steps of:
  providing a heating element between the periphery, more specifically between the plane defined by said periphery, of the substrate support and the process-side surface, wherein the heating element comprising a passage, providing a source of treatment material at a distance from the periphery, more specifically at a distance of the plane defined by said periphery, of the substrate support on the opposite side of the base, providing an enclosure, surrounding at least the base, the substrate support, the heating element and the source of treatment material, applying a vacuum to the enclosure, and providing electrical power to the heating element for heating the substrate, based on the electromagnetic radiation detected by the radiation sensor.

The features of the above-mentioned embodiments of the method can be used in any combination, unless they contradict each other.

BRIEF DESCRIPTION OF THE DRAWINGS

Embodiments of the current invention are described in more detail in the following with reference to the figures. These are for illustrative purposes only and are not to be construed as limiting. It shows FIG. 1 a cross-section through a first embodiment of a substrate processing apparatus according to the invention.

DETAILED DESCRIPTION OF THE INVENTION

Figure 1:
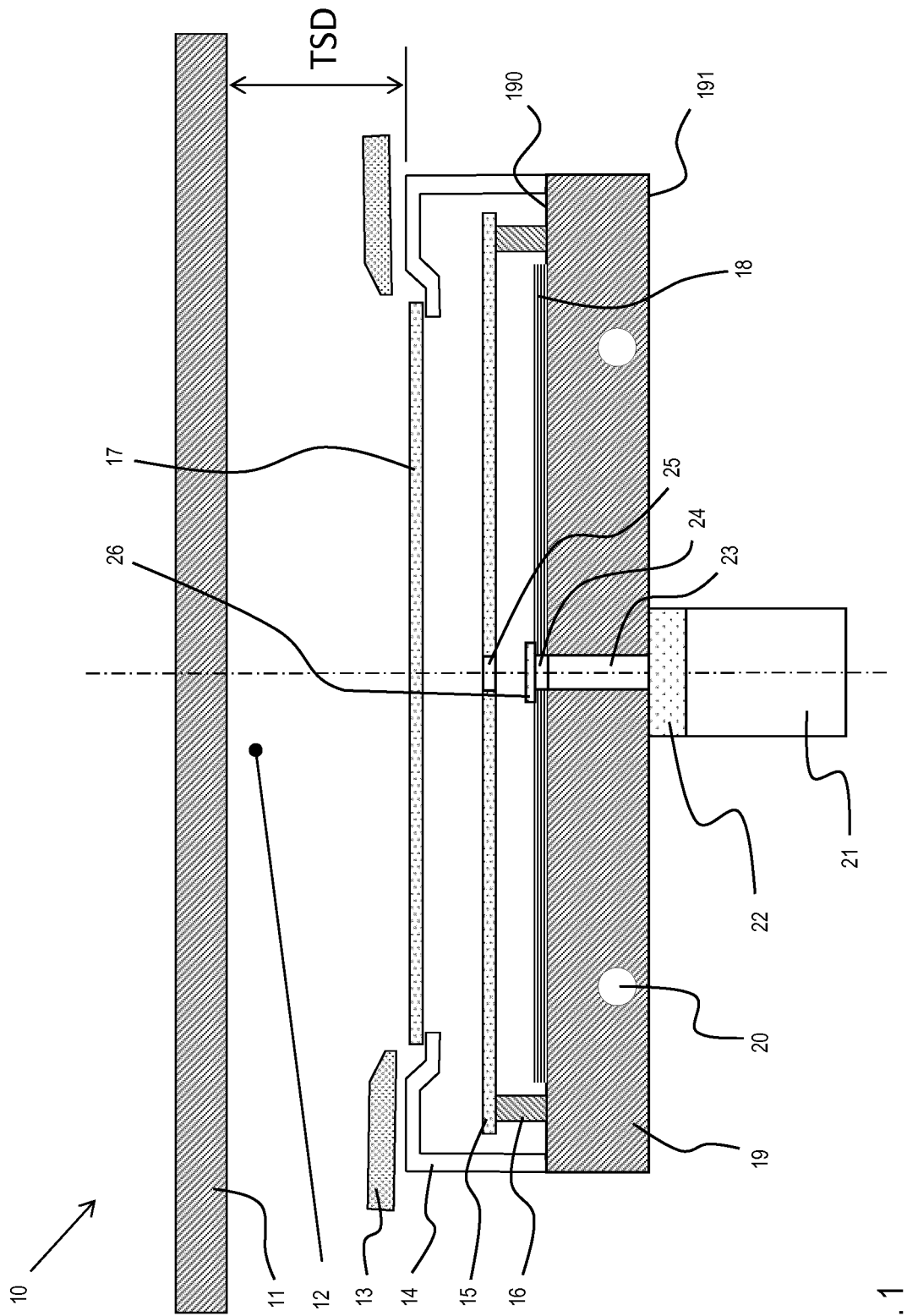

A substrate processing apparatus 10 comprises a base 19 to be arranged in a vacuum processing chamber. Said chamber or enclosure has been omitted in FIG. 1 and can be designed as known in the art, including necessary means for generating a vacuum, removing waste gases, electrical wiring and load/unload facilities for the substrate. On said base 19 a heating element 15 is arranged, preferably mounted in parallel to the surface of base 19 on post(s) 16 providing a clearance between base 19 and said heating element 15. The heating element can basically be chosen from prior art heating elements, such as resistive heaters, in particular radiation heaters or, especially preferred, a carbon or silicon carbide heater arrangement. In a plane again parallel to said base 19 and heating element 15 a substrate 17 can be arranged, preferably in a distance between 5 Centimetre and 8 Centimetre between the substrate and the target. Said substrate 17 is preferably held by a substrate support 14, which can be designed as a ring-shaped bearing area or as a selective support at the circumference of the substrate.

At the side of the back-side 191 of the base 19, a radiation sensor 21 with a radiation conductor 22 is arranged. The radiation sensor can, for example, be a pyrometer. The signals detected by the radiation sensor 21 might be filtered, e.g. by selecting a small or in other words narrow wavelength window for the sensor, allowing to measure mainly the radiation emitted by the substrate and not gathering too much information of the surrounding, e.g. radiation coming from the heater or through the substrate, e.g. plasma radiation. A radiation channel 22, 23, 24, 25, 26 is arranged between the radiation sensor 21 and the periphery of the substrate support 14, more specifically between the radiation sensor 21 and the plane defined by said periphery. The radiation channel is preferably placed in the centre of the base 19. The radiation conductor 22 and an additional radiation conductor 26 are part of the radiation channel. The radiation channel is at least partially permeable to electromagnetic radiation. The passage 23 in the base, the passage 24 in the heat reflecting surface 18 and the passage 25 in the heating element 15 are empty. Thus, electromagnetic radiation can pass through these passages unhindered. The radiation conductor 22 and/or the additional radiation conductor 26 are fully permeable as well or can absorb part of the radiation. In FIG. 1, the radiation conductor 22 and the additional radiation conductor 26 are optical glass plates. In the embodiment of FIG. 1, the radiation conductor 22 is arranged on the back-side surface 191 of the base 19 and the additional radiation conductor 26 is arranged on the heat reflecting surface 18. Alternatively, the radiation conductor 22 can be arranged at a distance to the back-side surface 191, mounted in a sleeve that is mounted to the back-side surface 191.

During processing, the substrate is placed on the substrate support 14 and held by its own weight. So, no mechanical stress is being exerted by fastening means. In a further plane parallel to the base 19, a heating element 15 and a target 11 are mounted. The substrate support 14 and the heating element 15 are arranged on the front-side surface 190 of the base. During processing, between the substrate 17 and target 11 the processing space 12 is available. The processing space will exhibit plasma during sputtering. Working gases (reactive or inert) may be injected near the target edges from the side. PVD sputtering processes are known in the art and thus are not described herein in detail. Material is being plasma-sputtered from target 11 and being deposited on substrate 17. A shield 13 may be foreseen to protect substrate support 14 from being covered with target material. Such shield 13 may be easily exchanged during maintenance intervals. As shown in FIG. 1 the shields are construed in such a way that a layer deposited on substrate 17 is covering the full surface facing the target 11.

The heating element 15, preferably a heater containing carbon, in particular a carbon heater, is a radiation-type heating element. In an embodiment of the invention, the carbon heating element is being connected to a power source able to deliver 3 kW to 10 kW of electrical power. To allow for an effective heat management, a mirror or reflective means 18, preferably with good reflective properties in the infrared part of the spectrum is being arranged directly on base 19 facing the heating element 15 (on the side averted from substrate 17, as shown in FIG. 1). The radiation is essentially being trapped and reflected between the two reflective surfaces until it is being absorbed by the substrate (or lost).

Base 19 is cooled, preferably by a fluid in channels 20 foreseen in the metal block towards the back-side surface 191. Alternatively, the cooling channels can be in the centre of the base or towards the process-side surface 190. Preferably mirror 18 and substrate support 14 thus use base 19 as heat sink.

Heat-Reflective mirror 18 can be manufactured as a nickel coating or as an exchangeable thin nickel plate mounted onto base 19. Other high reflective materials with good reflectivity especially in the infrared part of the spectra are also useful.

The counterpart or second mirror to the cavity is target 11. Basically, the same reflectivity requirements are valid as for mirror 18, however of course the layer to be deposited determines the choice of material. Examples for applicable materials are Al, Ti, Ag, Ta and their alloys.

Due to the efficiency of the heating element 15, the substrate support 14 has to be made from a material able to withstand high temperatures. Titanium is a material of choice or high-tensile steel may be used.

The inventive substrate processing apparatus 10 is not limited to the use with a sputtering target 11 in a PVD application. It can be used in a CVD or PECVD application, wherein instead of target 11 a showerhead or another overhead processing gas inlet is being arranged. It is being understood that the a.m. limitations and requirements for the "thermal cavity" quality need to be fulfilled by the showerhead or gas inlet in an equivalent manner. Materials like polished steel, Ni, Al could be used.

Figure 2:
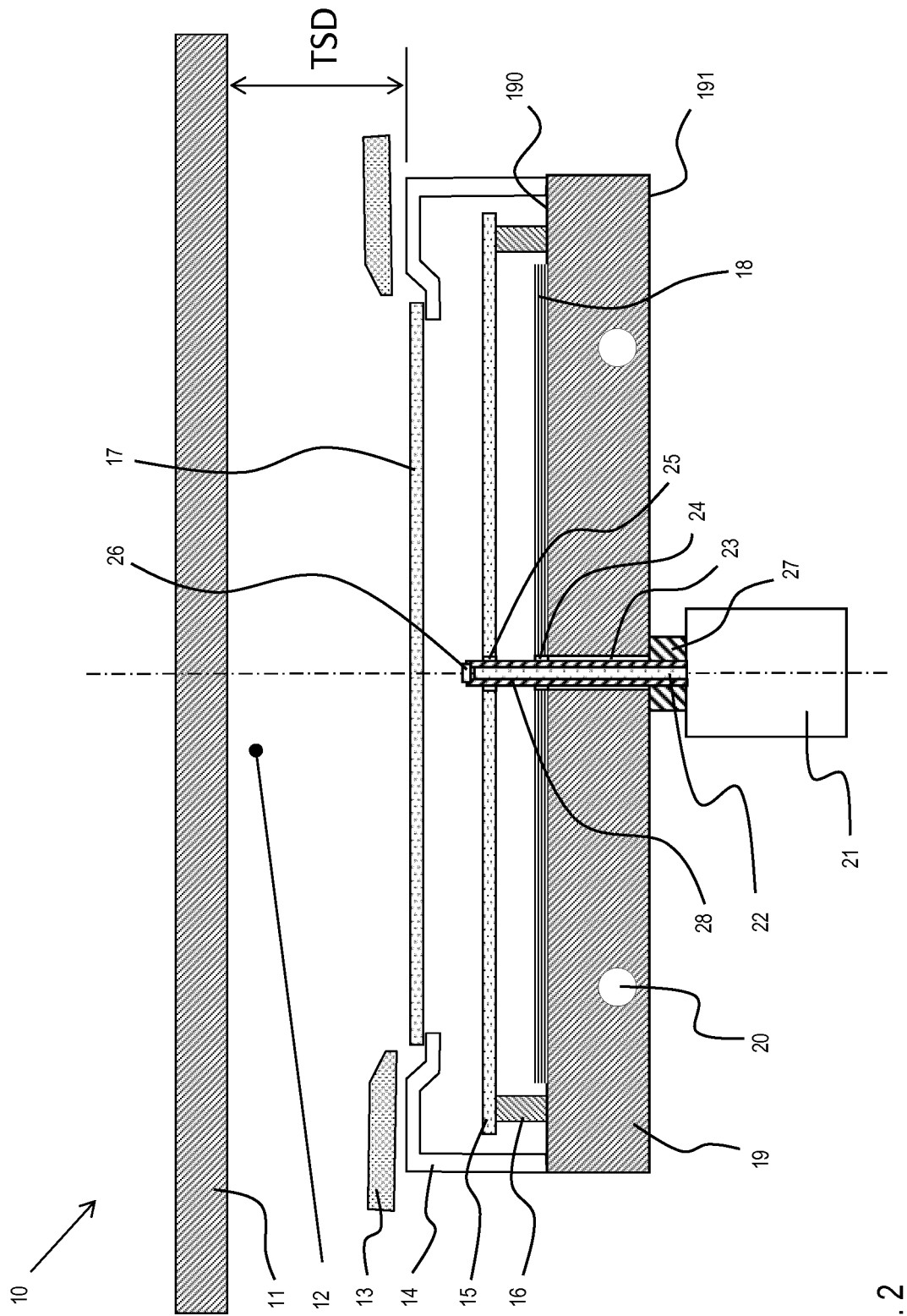
FIG. 2 a cross-section through a second embodiment of a substrate processing apparatus according to the invention.

FIG. 2 shows a further embodiment of a substrate processing apparatus 10 according to the invention. The embodiment of FIG. 2 corresponds to the one of FIG. 1. Only the design and the arrangement of the radiation sensor 21 and the radiation conductor 22 are different. The radiation conductor 22 is arranged at least partially in the passages of the base 19, the heat reflecting surface 18 and the heating element 15. The radiation conductor 22 is an optical glass fibre. There is a gap between the radiation conductor 22 and the additional radiation conductor 26. The radiation conductor 22 is laterally surrounded by a sleeve 28. In the shown embodiment, sleeve 28 fully surrounds radiation conductor 22 and is inter alia arranged within the passage 23 of the base 19, the passage 24 of the heat reflecting surface 18 and the passage 25 of the heating element 15. However, the sleeve 28 can also only surround part of the radiation conductor 22 and leave e.g. the end of the radiation conductor 22 pointing in direction of the plane defined by the periphery of the substrate support 15. It is also possible that the sleeve 28 is only arranged within the passage 23 of the base 19, the passage 24 of the heat reflecting surface 18 but not within the passage 25 of the heating element 15. The sleeve 28 is preferably made of a material having reflective properties, such as metal, and protects the radiation conductor 22 from mechanical and thermal loads. The additional radiation conductor 26 is arranged in the tip region of the sleeve 28. A sealing material 27 is arranged between the base 19 and the radiation conductor 22, respectively between the sleeve 28 and the base 19 to reduce the stress on the radiation conductor 26 due to the thermal load and the different thermal expansion coefficients of the base 19 or the sleeve 28 and the radiation conductor 26. The sleeve 28 extends through the base 19, the reflecting surface 18 and the heating element 15 and over the heating element 15. There should always be a free space between the periphery, more specifically between the plane defined by said periphery, of the substrate support 14 and the tip of the sleeve 28, respectively and the front-face of the additional radiation conductor 26. The smaller the distance between said periphery, more specifically between the plane defined by said periphery, and the additional radiation conductor 26, the less is the scattered radiation entering the sleeve 28, respectively the radiation conductor 22 and the more accurate is the radiation detection of a specific area on the substrate 17 during processing.

Figure 3:
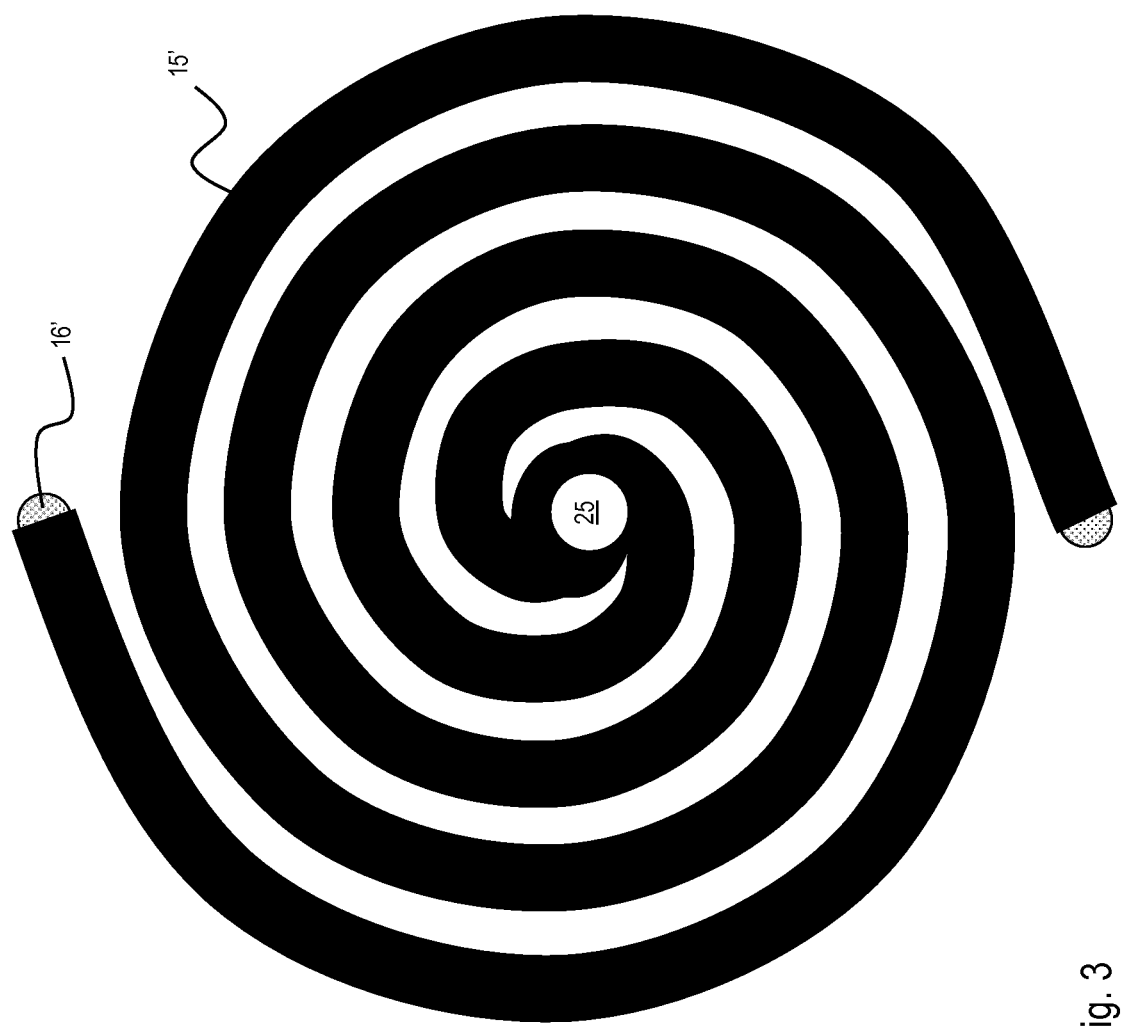
FIG. 3 a heating element according to the invention.

FIG. 3 is a top view one of an embodiment of a heating element 15'. The posts 16' are equivalent to posts 16 in FIG. 1. This embodiment comprises a double-spiral structure with electrical connectors lying outside and a passage 25 in the centre of the double-spiral. The heating element can be cut from a carbon-fibre plate or be pressed in a respective mould. Carbon-fibres or carbon fibre-composites are per se known and are available in the market. The shape of the heating element (width and thickness of the windings) can be optimized to allow for a homogeneous heating effect. In an embodiment a thickness of 2.5 mm had been chosen, which is a compromise of weight, stability of the material and the overall electrical resistance. In cross-section, a rectangular shape of the individual winding is preferred over square or round shapes.

The resulting structure can be self-supporting, depending on the diameter and thickness of the heating element. If a bending during operation occurs, the structure could be stabilized by means of ceramic rest.

FIG. 3 shows the alignment of a substrate 17 in relation to the heating element 15. It is preferred to arrange the electrical connection outside the effectively heated substrate area, since the connector will not exhibit the same working temperature as the heating element itself. Thus, temperature inhomogeneities especially in the edge region of the substrate can be avoided. Consequently, the size of the heating element will be essentially the size of the substrate plus the extensions for the connectors.

The thermal conditioning arrangement and the electromagnetic radiation detection arrangement are of course also functional for non-reflective targets 11 and/or highly absorptive substrates 17. A SiC substrate e.g. would not require a thermal cavity with two reflective surfaces. However, the arrangement of mirror 18 behind the heating element will still enhance the heating efficiency in this case.

The invention as described above can be used for circular, rectangular or square substrates of different sizes. It may be preferably used in substrate processing systems designed for processing of 4", 6", 8" (200 mm) or 12" (300 mm) wafer diameters. Due to the nature of its heating element intermediate sizes can be easily construed.

The temperature conditioning arrangement as described has a low thermal inertia due to its direct radiation heating principle. It can be advantageously used to allow a substrate heat-up quickly or in steps via varying the electrical power in steps. The same advantage applies to cooling down scenarios.

Figure 4:
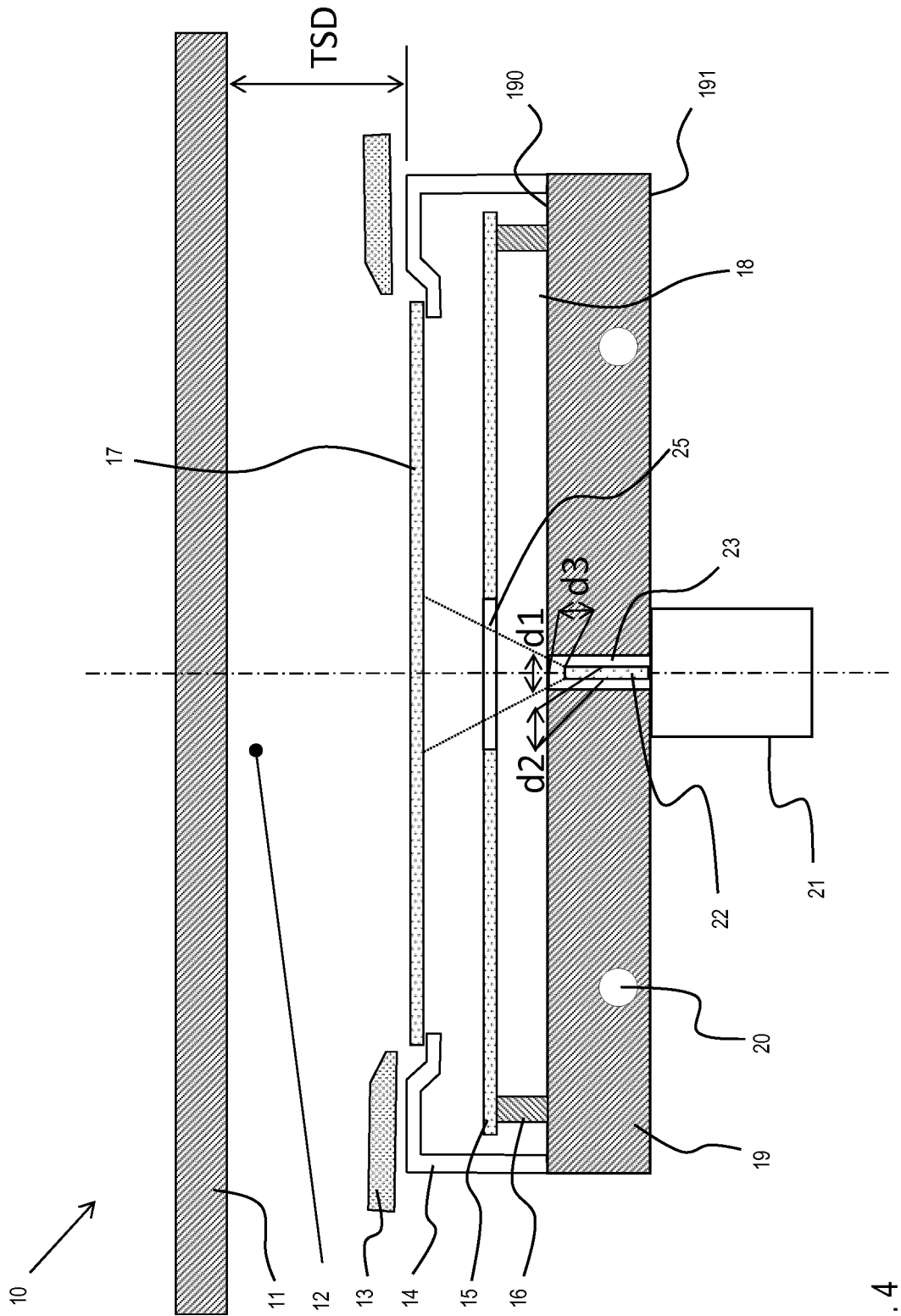
FIG. 4 a cross-section through a third embodiment of a substrate processing apparatus according to the invention.

FIG. 4 shows a further embodiment of a substrate processing apparatus 10 according to the invention. The embodiment of FIG. 4 corresponds to the ones of FIGS. 1 and 2 but differs in various aspects. For instance, the embodiment of FIG. 4 comprises only one radiation conductor 22 which is arranged within the passage 23 of the base 19 such that there is a clearance d3 between the radiation conductor 22 and the process-side surface 190 of the base 19. The radiation conductor 22 comprises a diameter d2 of approximately 85% to 90% of the diameter d1 of the passage 23 in the base 19. The passage 23 of the base 19 works as a hole aperture. This function is indicated by the dashed lines representing the optical path and thus the acceptance angle of the radiation detector 21. The passage 25 of the heating element 15 is designed large enough to not further delimit the acceptance angle. Although no heat reflecting surface is shown in this embodiment, a heat reflecting surface would well be compatible with the shown embodiment. In case there is no extra heat reflecting surface, a base having a process-side surface being at least partially heat reflecting is beneficial. The source of treatment material 11 could e.g. be a target or a shower head. The radiation conductor 22 could be surrounded by a sleeve. A sealing material could be arranged between the passage 23 of the base 19 and the radiation conductor 22 or between the passage 23 of the base 19 and the sleeve. The passage 23 of the base 19 could also comprise more than one radiation conductor. The base 19 can be cooled but must not be cooled. The radiation detector 21 could be arranged flush with the base 19 on its back-side surface 191, however, the radiation detector may be 21 be arranged in a distance to the base, e.g. with a further radiation conductor and/or a sealing material as spacer. The radiation detector 21 could also be arranged somewhere else in the surrounding of the base 19, e.g., next to the base 19.

Figure 5:
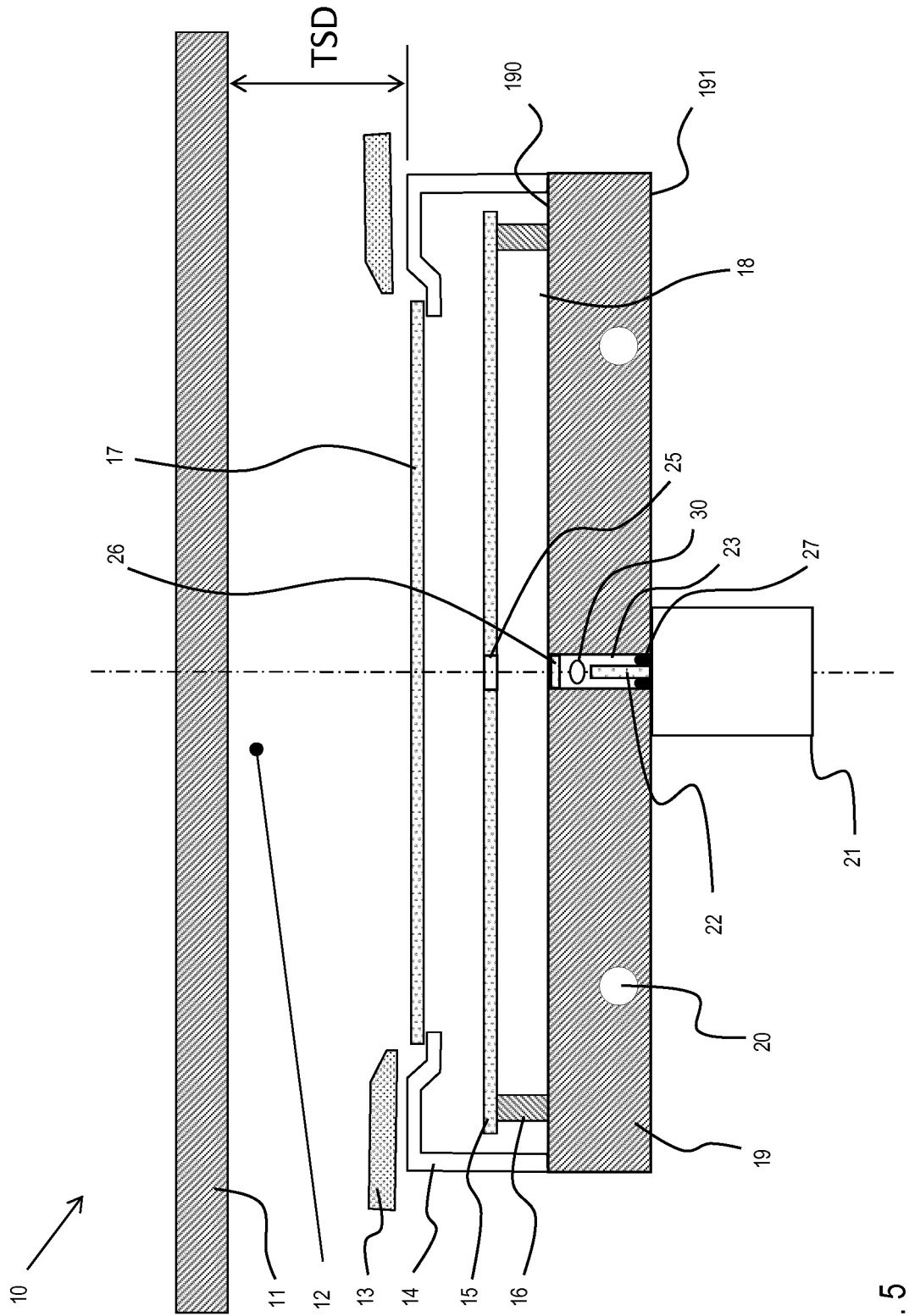
FIG. 5 a cross-section through a fourth embodiment of a substrate processing apparatus according to the invention.

FIG. 5 shows a further embodiment of a substrate processing apparatus 10 according to the invention. The embodiment of FIG. 5 corresponds to the ones of FIGS. 1, 2, and 4 but differs in some aspects. In this embodiment, the acceptance angle is, inter alia, defined by the small diameter of the passage 25 in the heating element 15 and a lens 30 being sandwiched between a first radiation conductor 22 and an additional radiation conductor 26, all three of them being arranged within the passage 23 of the base 19. It is also possible to replace the additional radiation conductor 26 by lens 30 or an additional lens (not shown) and thus waive the additional radiation conductor 26. A sealing material 27 is arranged within the passage 23 of the base 19 such that it surrounds the bottom part of the radiation conductor 22 and allows the radiation sensor 21 to be surrounded by atmospheric pressure wherein the rest of the apparatus is surrounded by a lower pressure than atmospheric pressure. Although no heat reflecting surface is shown in this embodiment, a heat reflecting surface would well be compatible with the shown embodiment. In case there is no extra heat reflecting surface, a base having a process-side surface being at least partially heat reflecting is beneficial. The source of treatment material 11 could e.g. be a target or a shower head. The radiation conductor 22 could be surrounded by a sleeve. A sealing material could be arranged between the passage 23 of the base 19 and the radiation conductor 22 or between the passage 23 of the base 19 and the sleeve. The passage 23 of the base 19 could also comprise one or more further radiation conductors. The base 19 can be cooled but must not be cooled. The radiation detector 21 could be arranged flush with the base 19 on its back-side surface 191, however, the radiation detector may be 21 be arranged in a distance to the base, e.g. with a further radiation conductor and/or a sealing material as spacer. The radiation detector 21 could also be arranged somewhere else in the surrounding of the base 19, e.g., next to the base 19.

REFERENCE SIGNS LIST

10 Substrate processing apparatus
11 Source of treatment material
12 Processing space
13 Shield
14 Substrate support
15 Heating element
15' Heating element
16 Post
16' Post
17 Substrate
18 Heat reflecting surface
19 Base
190 Process-side surface
191 Back-side surface
20 Cooling channels
21 Radiation sensor
22 Radiation conductor
23 Passage base
24 Passage heat reflecting surface/reflecting process-side surface of base
25 Passage heating element
26 Radiation conductor
27 Sealing material
28 Sleeve
30 Lens

What is claimed is:

1. A substrate processing apparatus comprising:
   a base with an extended, essentially plane process-side surface and a back-side surface,
   a substrate support, arranged on the process-side surface and designed to carry a substrate at its periphery, the periphery defining a plane being spaced apart from the process-side surface,
   a heating element arranged on the base, between the plane defined by said periphery of the substrate support and the process-side surface, the heating element comprising a passage allowing the passage of electromagnetic radiation from the plane defined by said periphery of the substrate support to the process-side surface
   at least one radiation sensor adapted to measure electromagnetic radiation and arranged on a side of the back-side surface of the base opposite the process-side surface or arranged sideways with respect to the base or arranged on a side of the process-side of the base with a lateral offset,
   at least one radiation channel, arranged between the at least one radiation sensor and the plane defined by said periphery of the substrate support,
   wherein the at least one radiation channel is at least partially permeable to electromagnetic radiation and comprises:
   a first radiation conductor; and
   an additional radiation conductor arranged between the heating element and the first radiation conductor and configured to protect the first radiation conductor.

2. The substrate processing apparatus according to claim 1, wherein a source of treatment material is arranged at a distance from the plane defined by said periphery of the substrate support on the opposite side of the base.

3. The substrate processing apparatus according to claim 1, wherein the radiation channel comprises a passage in the base, extending from the process-side surface to the back-side surface.

4. The substrate processing apparatus according to claim 1, wherein a heat reflecting surface is arranged on the process-side surface, wherein the heat reflecting surface comprising a passage, allowing the passage of electromagnetic radiation from the plane defined by the periphery of the substrate support through the heat reflecting surface.

5. The substrate processing apparatus according to claim 3, wherein the first radiation conductor is arranged on the back-side surface.

6. The substrate processing apparatus according to claim 3, wherein a first radiation conductor is arranged within the passage of the base.

7. The substrate processing apparatus according to claim 6, wherein the first radiation conductor does not protrude from the passage in the base relating to the process-side surface of the base (19).

8. The substrate processing apparatus according to claim 5, wherein the additional radiation conductor is on a surface of the reflecting surface, covering at least the passage of the reflecting surface.

9. The substrate processing apparatus according to claim 8, wherein the first radiation conductor is laterally surrounded by a sleeve.

10. The substrate processing apparatus according to claim 3, wherein a sealing material is arranged between the radiation conductor and the base.

11. The substrate processing apparatus according to claim 9, wherein a sealing material is arranged between the radiation conductor and the sleeve and/or between the sleeve and the base.

12. The substrate processing apparatus according to claim 1, wherein at least one radiation channel is formed as a lens or comprises a lens.

13. The substrate processing apparatus according to claim 12, wherein the lens is arranged between a first radiation conductor and an additional radiation conductor.

14. The substrate processing apparatus according to claim 1, wherein the radiation detector comprises an acceptance angle of 45° or less.

15. The substrate processing apparatus according to claim 1, wherein cooling channels are arranged in the base.

16. The substrate processing apparatus according to claim 4, wherein the first radiation conductor is arranged within the passage of the base or within the passages of the base and the heat reflecting surface or within the passages of the base, the heat reflecting surface and the heating element.

17. A substrate processing apparatus comprising:
a base with an extended, essentially plane process-side surface and a back-side surface,
a substrate support, arranged on the process-side surface and designed to carry a substrate at its periphery, the periphery defining a plane being spaced apart from the process-side surface,
a heating element arranged on the base, between the plane defined by said periphery of the substrate support and the process-side surface, the heating element comprising a passage allowing the passage of electromagnetic radiation from the plane defined by said periphery of the substrate support to the process-side surface,
at least one radiation sensor adapted to measure electromagnetic radiation,
at least one radiation channel, arranged between the at least one radiation sensor and the plane defined by said periphery of the substrate support, the at least one radiation channel being at least partially permeable to electromagnetic radiation and comprises a passage in the base, extending from the process-side surface to the back-side surface, and at least a first radiation conductor being arranged on the back-side surface of the base and being laterally surrounded by a sleeve, and
an additional radiation conductor arranged between the plane defined by the periphery of the substrate support and the first radiation conductor.

18. The substrate processing apparatus according to claim 17, wherein a heat reflecting surface is arranged on the process-side surface, the heat reflecting surface comprising a passage allowing the passage of electromagnetic radiation from the plane defined by the periphery of the substrate support through the heat reflecting surface and wherein the additional radiation conductor is arranged on a surface of the reflecting surface covering at least the passage of the reflecting surface.

19. The substrate processing apparatus according to claim 17, wherein a sealing material is arranged between the radiation conductor and the sleeve and/or between the sleeve and the base.

20. A substrate processing apparatus comprising:
a base with an extended, essentially plane process-side surface,
a substrate support, arranged on the process-side surface and designed to carry a substrate at its periphery, the periphery defining a plane being spaced apart from the process-side surface,
a heating element arranged on the base, between the plane defined by said periphery of the substrate support and the process-side surface, the heating element comprising a passage allowing the passage of electromagnetic radiation from the plane defined by said periphery of the substrate support to the process-side surface,
at least one radiation sensor adapted to measure electromagnetic radiation,
at least one radiation channel, arranged between the at least one radiation sensor and the plane defined by said periphery of the substrate support, the at least one radiation channel being at least partially permeable to electromagnetic radiation, and
wherein at least one radiation channel is formed as a lens or comprises a lens.

21. The substrate processing apparatus according to claim 20, wherein the lens is arranged between a first radiation conductor and an additional radiation conductor.

22. A method of processing a substrate and of manufacturing a processed workpiece in a substrate processing apparatus comprising the steps of:
providing the substrate processing apparatus according to one of the preceding claims,
placing a substrate on the periphery of the substrate support,
coating the substrate, and
detecting electromagnetic radiation with the radiation sensor.

* * * * *

UNITED STATES PATENT AND TRADEMARK OFFICE
CERTIFICATE OF CORRECTION

PATENT NO. : 11,551,950 B2
APPLICATION NO. : 16/767160
DATED : January 10, 2023
INVENTOR(S) : Hartmut Rohrmann It is certified that error appears in the above-identified patent and that said Letters Patent is hereby corrected as shown below:

In the Claims

In Column number 14, Line number 60, the last line of Claim 7, please delete "(19)".

Signed and Sealed this
Twenty-first Day of May, 2024

Katherine Kelly Vidal
*Director of the United States Patent and Trademark Office*